United States Patent
Chang et al.

(10) Patent No.: US 6,347,380 B1
(45) Date of Patent: Feb. 12, 2002

(54) SYSTEM FOR ADJUSTING CLOCK RATE TO AVOID AUDIO DATA OVERFLOW AND UNDERRUN

(75) Inventors: Steve Chang, Fremont; Jiwen Cai, Cupertino, both of CA (US)

(73) Assignee: KC Technology, Inc., Milpitas, CA (US)

( * ) Notice: Subject to any disclaimer, the term of this patent is extended or adjusted under 35 U.S.C. 154(b) by 0 days.

(21) Appl. No.: 09/261,414

(22) Filed: Mar. 3, 1999

(51) Int. Cl.[7] .................................................. G06F 1/04

(52) U.S. Cl. ..................................................... 713/503

(58) Field of Search ................................ 713/503, 600; 710/58, 60; 711/167, 168, 169

(56) References Cited

U.S. PATENT DOCUMENTS 5,778,218 A     7/1998    Gulick
6,055,216 A * 4/2000    Shintani ........................ 369/32

OTHER PUBLICATIONS

"Universal Serial Bus Specification," Compaq, Digital Equipment Corporation, IBM PC Company, Intel, Microsoft, Northern Telecom, Revision 0.9, Mar. 31, 1995, pp. ii–120.

* cited by examiner

Primary Examiner—Thomas M. Heckler
(74) Attorney, Agent, or Firm—Skjerven Morrill MacPherson LLP; James S. Hsue (57) ABSTRACT

A phase locked loop is employed to provide a clock signal for controlling the reading or writing of audio data from or into a memory to avoid memory overflow and underrun. The difference between the write and read pointers is monitored and used for adjusting a divider counter used in the feedback loop of the phase locked loop, by incrementing, decrementing by one or leaving unchanged the value of the counter. The counter is used to divide the output of the phase locked loop to provide a reference signal to the phase locked loop. A reference frequency for reading the audio data may be set close to the writing speed by incrementing or decrementing the reading speed by fine adjustment steps until the reference frequency is reached. After the reference frequency is reached, the reading speed is changed between the reference frequency and a frequency one fine adjustment step away from the reference frequency so that the average reading speed is equal to the writing speed.

47 Claims, 6 Drawing Sheets

SYSTEM FOR ADJUSTING CLOCK RATE TO AVOID AUDIO DATA OVERFLOW AND UNDERRUN

BACKGROUND OF THE INVENTION

This invention relates in general to systems for processing audio data and in particular to an audio system or sub-system for adjusting clock rate to avoid audio data overflow and underrun.

When audio data is transferred between systems, the audio data is typically written into a buffer at a writing speed and read at a rate of reading during the transfer. If the audio data is read from the buffer at a rate slower than the writing speed, the audio data in the buffer will overflow, resulting in loss of data. On the other hand, if the audio data is read at a rate faster than the writing speed, buffer underrun will occur, resulting in the wrong data being read. If the audio data read from the buffer is played back through a speaker, the corruption of audio data due to the memory overflow or underrun will be immediately noticed by the listener and is undesirable.

The Universal Serial Bus ("USB") is intended as a bi-directional, isochronous, low-cost, dynamically attachable serial interface to promote easy personal computer peripheral expansion and provide full support for real-time voice, audio and compressed video data. The USB specification is a proposed standard promulgated by a group of computer companies including Compaq Computer Corporation, Digital Equipment Corporation, IBM Corporation, Intel Corporation, MicroSoft Corporation and Northern Telecom. The USB Specification, Compaq et al. Revision 0.9, Mar. 31, 1995 is hereby incorporated by reference.

Where the audio data is transferred from a host computer through an isochronous bus such as the USB to a peripheral such as a speaker sub-system, the host computer clock should be operated at the same rate as the speaker sub-system. However, due to the inaccuracy of the components used in the host system and in the audio sub-system, the two operating frequencies will be different. No matter how small the difference is, the cumulative effect of the difference over time will cause memory overflow or underrun at the audio sub-system memory. Such audio data overflow or underrun may cause problems when the audio data is converted by an audio CODEC and played back through a loud speaker. Even after synchronizing clock rates so that such audio data overflow or underrun does not occur at the host system memory, audio data overflow or underrun can still occur at the audio sub-system memory, such as at a FIFO supplying audio data to a audio coder/decoder ("CODEC") where the digital audio data is converted to audio analog data which is then sent directly to the speaker for playback.

SUMMARY OF THE INVENTION

Audio data overflow or underrun is avoided by adjusting the rate of reading audio data from the memory. A phase locked loop generates a clock signal for controlling the rate of reading or writing the audio data from or into the memory. A condition that will cause memory overflow or underrun is detected. The phase locked loop is caused to adjust the clock signal in response to a detected condition that will cause memory overflow or underrun. The clock signal is adjusted so that memory overflow and underrun is avoided.

Audio data overflow and underrun can also be avoided in an audio sub-system memory that supplies audio data to the audio CODEC by adjusting the rate of reading or writing audio data from or into the audio sub-system memory. The audio CODEC performs analog to digital and digital to analog conversions of audio data supplied to a speaker and received from a microphone. A condition that will cause audio sub-system memory overflow or underrun is detected and the rate of reading or writing audio data from or into the memory is adjusted in response to such condition to avoid memory overflow and underrun.

BRIEF DESCRIPTION OF THE DRAWINGS

For simplicity in description, identical components are labelled by the same numerals in this application.

DETAILED DESCRIPTION OF THE PREFERRED EMBODIMENTS

Figure 1:
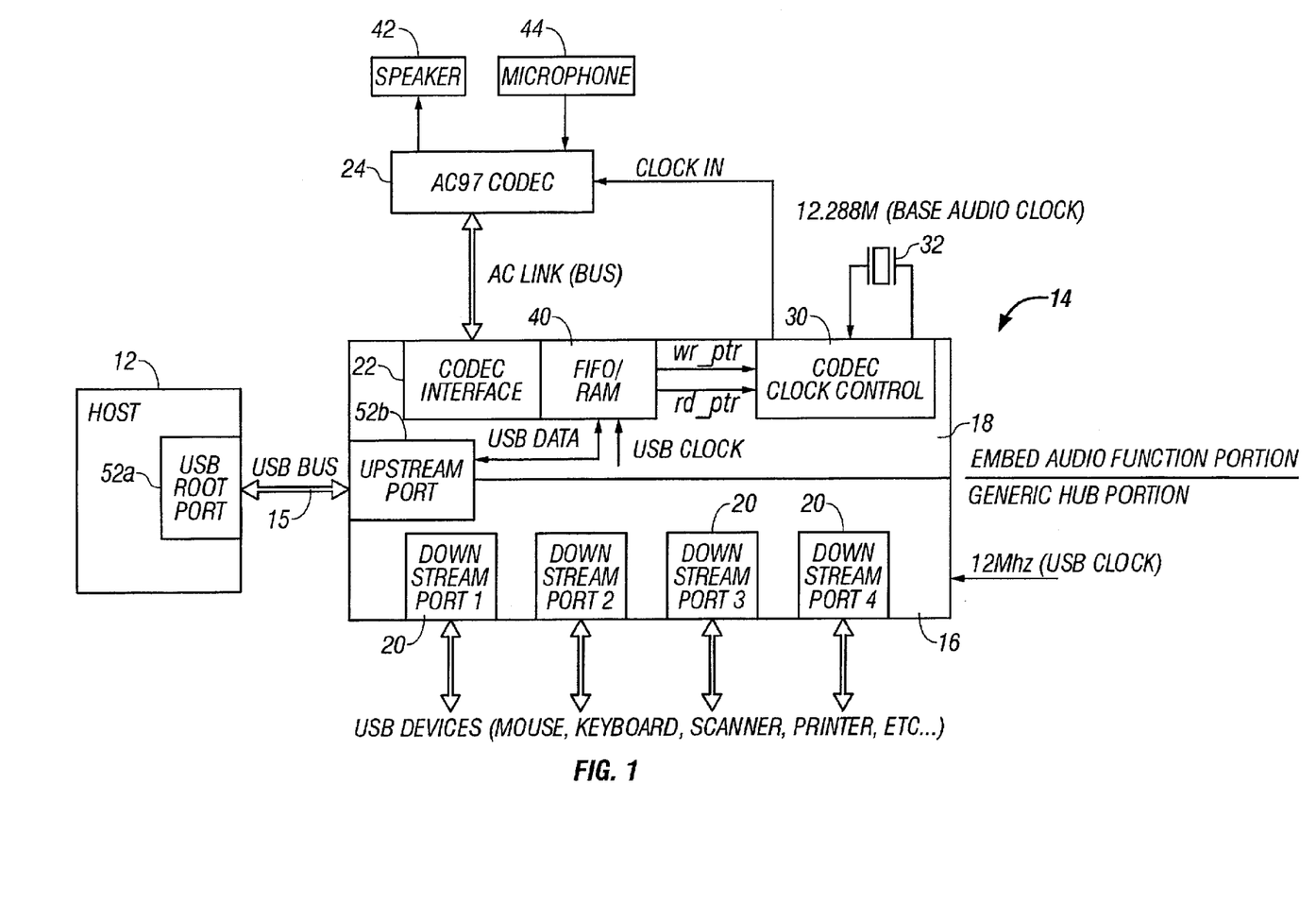
FIG. 1 is a block diagram of a host computer and a universal serial bus ("USB") audio/hub system having an audio sub-system to illustrate the preferred embodiment of the invention.

FIG. 1 is a block diagram of a host computer 12 and a USB peripheral device 14 and an audio CODEC 24 to illustrate the invention. As shown in FIG. 1, a host computer 12 is connected to a USB device 14 through a USB bus 15. The USB device 14 contains a generic hub portion 16 and an embedded audio function portion 18. The hub portion 16 communicates with other USB devices such as mouse, keyboard, scanner and printer (not shown) through downstream ports 20. The embedded audio function portion 18 includes a CODEC interface 22, a CODEC clock control 30 and FIFO/RAM 40. A crystal 32 supplies a clock signal to the CODEC clock control. The CODEC clock control 30 supplies a clock signal to the CODEC 24 which generates a bit clock which is applied to the interface 22 for generating a SYNC signal. The SYNC signal is employed to read an audio frame from FIFO/RAM ("FIFO") 40 in portion 18. The digital audio data read from FIFO 40 is applied through CODEC interface 22 to the CODEC 24 where the digital audio data is converted to analog audio signals and supplied to the speaker 42 for play back operation. Conversely, analog audio data received through microphone 44 is converted into digital data by CODEC 24 and supplied through interface 22 and written to FIFO 40 by means of a write clock (not shown) also generated from the SYNC signal.

Figure 2A:
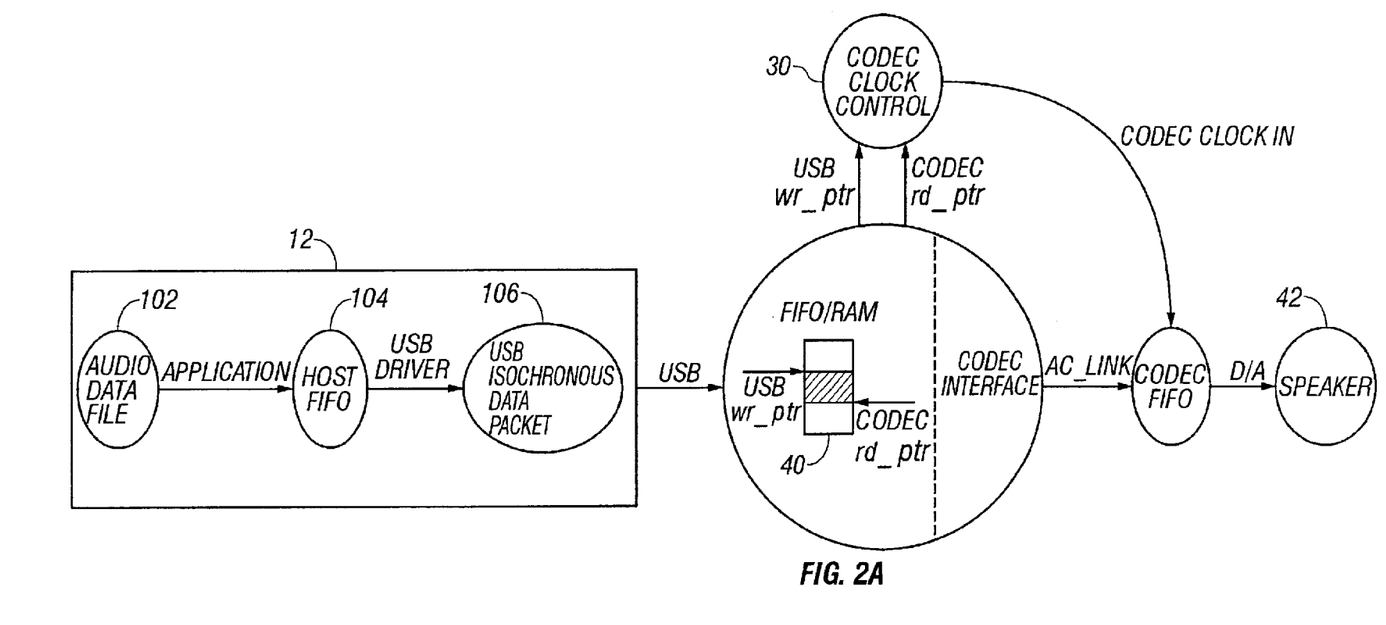
FIG. 2A is a flow diagram to illustrate the transfer of audio data from the host computer to the audio sub-system in FIG. 1 to illustrate the preferred embodiment of the invention.
Figure 2B:
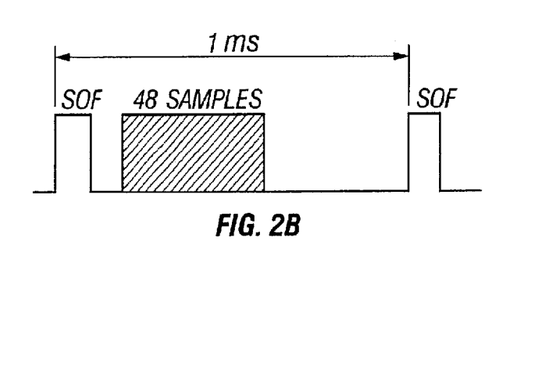
FIGS. 2B and 2C are timing diagrams to illustrate the audio transfer process in FIG. 2A.

FIG. 2A is a dataflow diagram illustrating the flow of audio data from the host computer 12 to the speaker 42. As shown in FIG. 2A, the audio datafile 102 is first stored in a host FIFO 104 in host computer 12 and is transferred as a USB isochronous data packet 106 through the USB root port 52a, USB bus 15, upstream port 52b to buffer or FIFO 40 in the peripheral device 14. If the sample rate is set at 48 kHz, the USB writing speed to FIFO 40 is 48 samples per frame, or 48 samples per millisecond. FIG. 2B is a timing diagram illustrating the process by which the USB isochronous data packet is written to FIFO 40. As shown in FIG. 2B, 48 samples are written between the occurrence of two consecutive start of frame signals that are one millisecond apart. While the invention is illustrated as applied to USB devices employing USB protocol, it will be understood that the invention may be used in devices other than USB employing other protocols and such applications are within the scope of the invention.

Figure 2C:
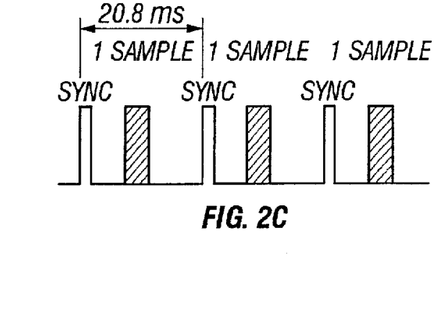

The audio data in FIFO 40 is then read under the control of SYNC signals derived from clock signals from CODEC clock control 30 and sent to a CODEC buffer (not shown) in CODEC 24, where CODEC 24 retrieves the data from the CODEC buffer and converts the data to analog audio data which is then sent to the speaker 42 for playback. FIG. 2C is a timing diagram for illustrating the process of reading audio data from FIFO 40 under the control of the SYNC signals. Where the writing and reading of data into and from the CODEC buffer in CODEC 24 are controlled by the same clock, buffer overflow and underrun would be unlikely to occur.

Figure 3:
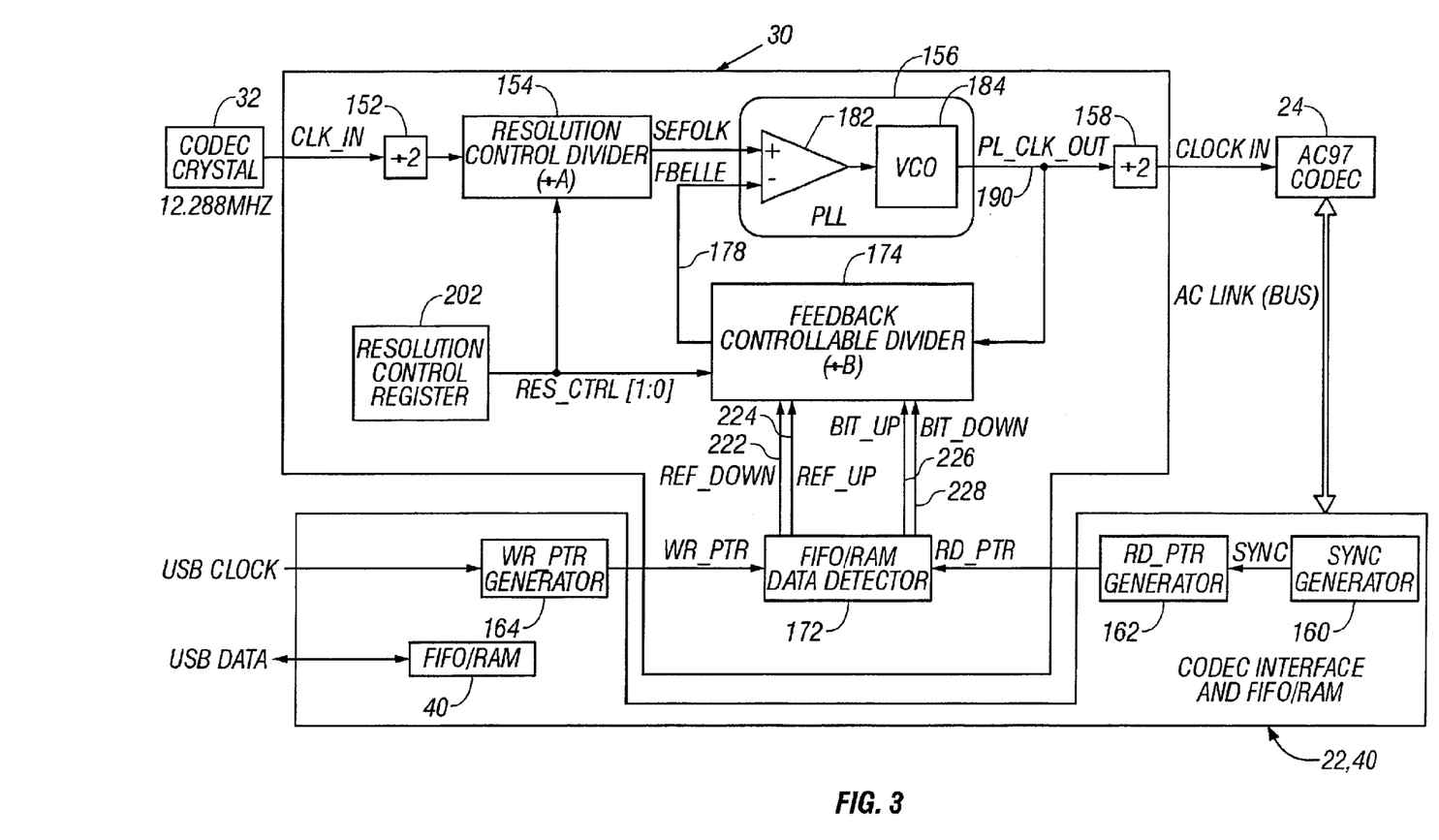
FIG. 3 is a block diagram of the CODEC clock control block and portions of the audio sub-system of FIG. 1 to illustrate the preferred embodiment of the invention.

The speed at which the audio data samples are written into FIFO 40 is controlled by a host USB clock (not shown) in host 12. The SYNC signals used for reading audio data from FIFO 40 and shown in FIG. 2C are derived from the clock signal from clock control 30. The clock signal from control 30 is in turn derived from the clock output of crystal 32. Even if the crystals used for generating the host USB clock and the clock 32 are specified to have the same frequency, the actual frequencies of the crystals are typically different so that the rate of reading audio data from FIFO 40 will be different from the writing speed. Thus, a commercially available crystal typically has a tolerance of ±15 ppm (parts per million). It is therefore desirable to adjust the clocks to avoid FIFO overflow and underrun. FIG. 3 is a block diagram of the CODEC clock control 30, CODEC 24, CODEC interface 22, FIFO 40 and CODEC crystal 32 of FIG. 1 to illustrate such process. As shown in FIG. 3, the 12.288 MHZ frequency signals from crystal 32 are supplied to control circuit 30. In control circuit 30, such clock is divided by a divide-by-two circuit 152 and divided by a resolution control divider 154 which divides its input by A to provide a clock signal to device 156. Device 156 provides an output clock signal to divide by two circuit 158 whose output is then the output of the CODEC clock control 30. Such clock signal is applied to CODEC 24 which transmits such signal as a bit clock to the SYNC generator 160 in interface 22 for generating a SYNC signal to control the reading of audio data from FIFO 40 as described above in reference to FIG. 2. The SYNC signal is also applied to a read pointer generator 162 which generates a read pointer for controlling the reading of data (not shown) from FIFO 40. A write pointer is generated by write pointer generator 164 in response to the USB clock for controlling the writing of all new data (not shown) into FIFO 40.

The read and write pointers are also supplied to a data detector 172 which subtracts the two pointers to determine how full FIFO 40 is. Depending on the amount of data in the FIFO 40, a four bit control signal (ref_down, ref_up, bit_up and bit_down) is then sent along four lines 222, 224, 226, 228 to a feedback controller diveder 174. Divider 174 divides the output of device 156 and supplies a reference clock to device 156. Device 156 the derives an output clock for the next reading cycle in response to the clock signal from divider 154 and the reference clock from devider 174.

Figure 4:
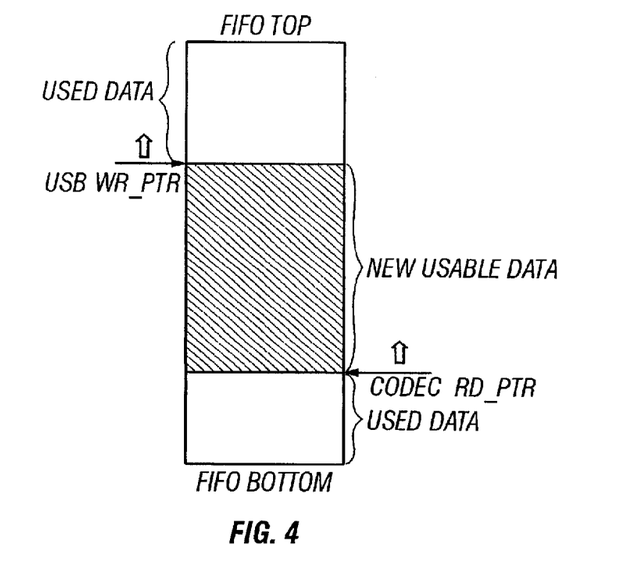
FIG. 4 is a schematic view of a first-in first-out memory ("FIFO") useful to illustrate the invention.

In the preferred embodiment, device 156 is a phase locked loop, which includes a phase detector 182 and a voltage controlled oscillator 184. Phase detector 182 compares the clock signal from divider 154 and the reference clock from divider 174 and generates a voltage as a function of the phase difference between the two input signals to control the oscillator 184 for deriving the clock output signal supplied to dividers 158 and 174. FIG. 4 is a schematic view of the structure of FIFO 40. The CODEC read pointer and USB write pointer as well as the new usable data and used data are as illustrated in FIG. 4.

Figure 5:
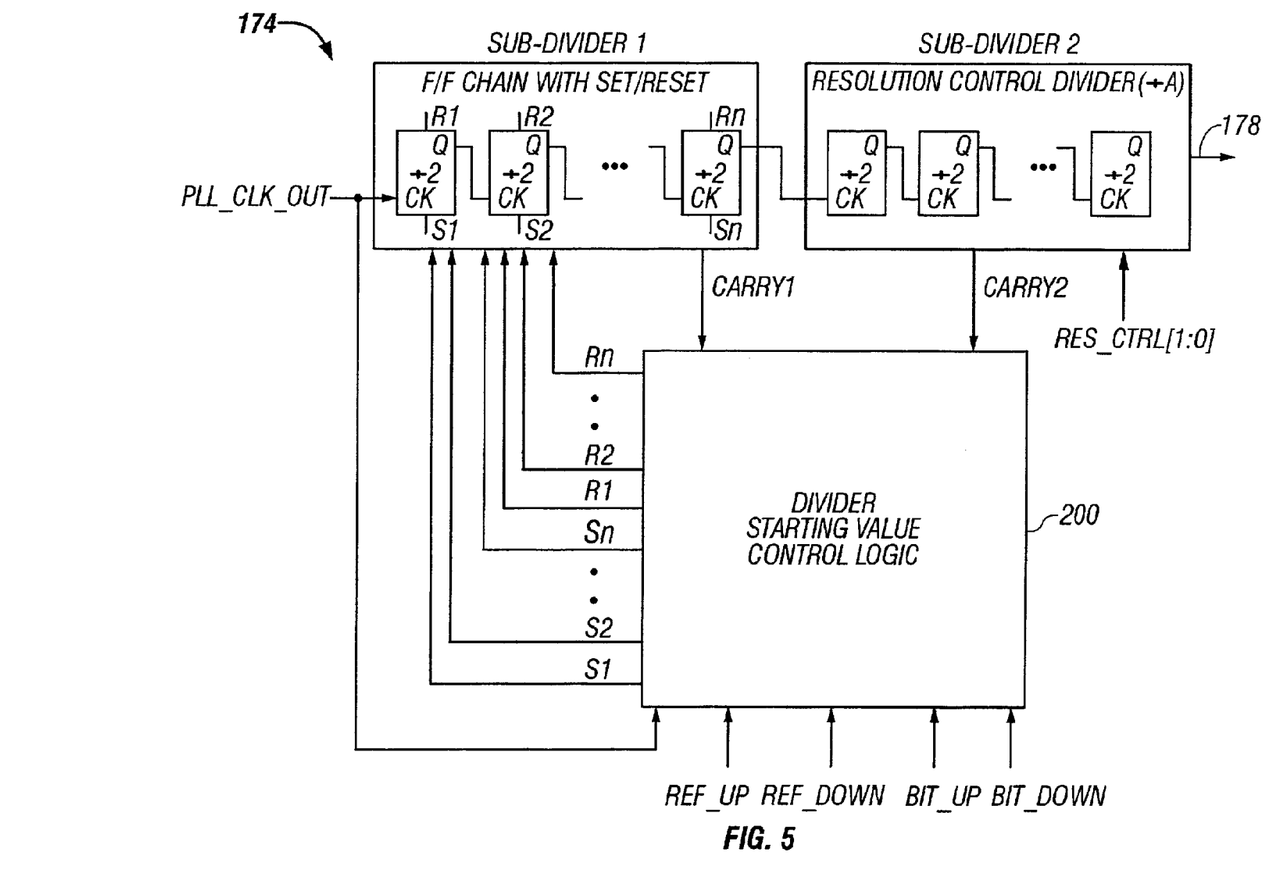
FIG. 5 is a block diagram of the feedback controllable divider block of FIG. 3 to illustrate the preferred embodiment of the invention.

FIG. 5 is a block diagram showing in more detail the feedback controllable divider 174. As shown in FIG. 5, divider 174 includes a sub-divider 1, a sub-divider 2 and a divider starting value control logic 200. The sub-divider 2 is a resolution control divider that is substantially the same as resolution control divider 154 in FIG. 3. Resolution control register 202 (FIG. 3) applies a resolution control signal (Res_ctrl) to the two resolution control dividers (154 and sub-divider 2) to adjust if necessary the common divider A employed by the two resolution control dividers. In other words, the two resolution control dividers control the minimum change in frequency of the reference clock at the output of feedback controller divider 174 that is supplied to device 156. The resolution control divider 154 is employed in the main circuit path of the clock signal in CODEC clock control 30 to cancel the effect of the sub-divider 2 in the feedback path.

Figure 6:
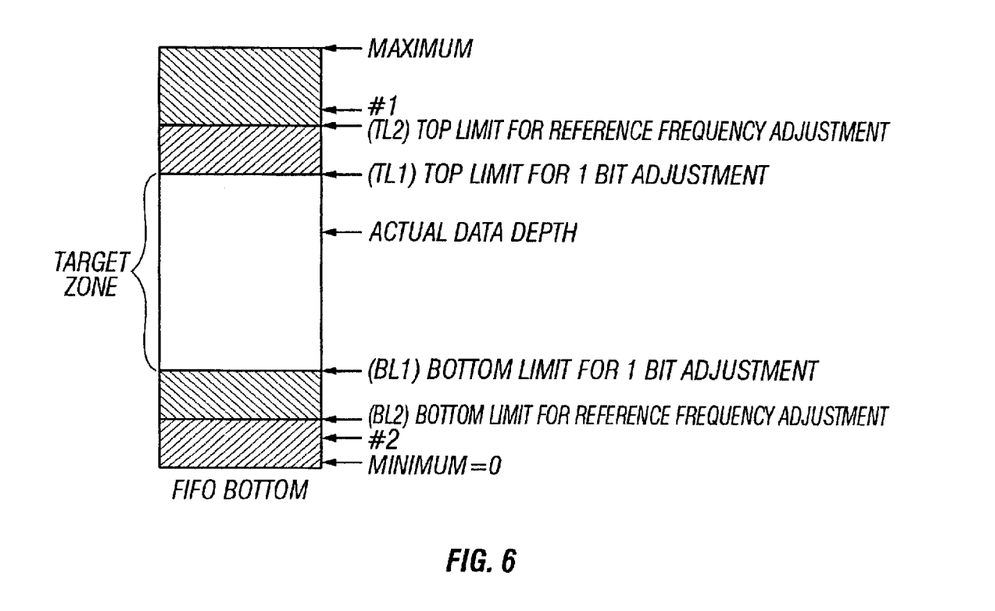
FIG. 6 is a conceptual view to illustrate operation of the FIFO of FIG. 4 and four limits for controlling clock adjustment to illustrate the preferred embodiment of the invention.
Figure 7:
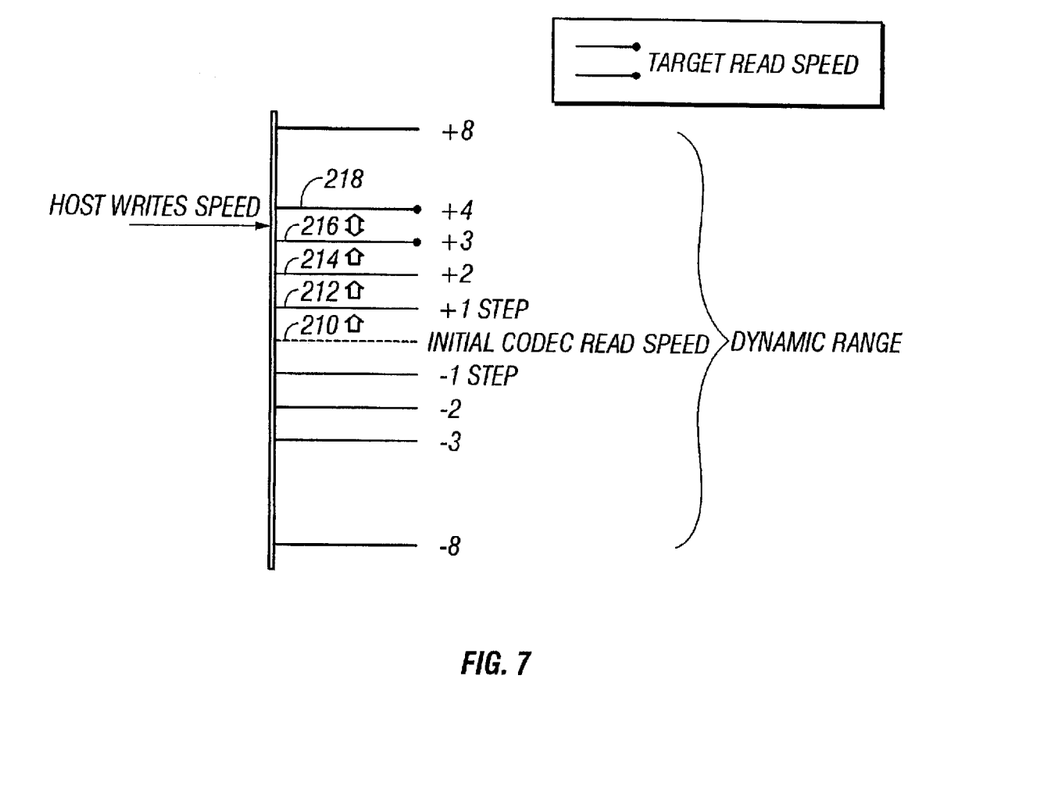
FIG. 7 is a schematic view of the dynamic range and adjustment steps of the reading speed or rate when the difference between the read and write pointers of the FIFO is at certain values relative to the limits of FIG. 6 to illustrate the preferred embodiment of the invention.

The operation of the feedback controller divider 174 will now be described by reference of FIGS. 6 and 7. FIG. 6 is a conceptual diagram of the process of reading and writing of data into FIFO 40 of FIG. 4 in relation to four limits for controlling clock adjustment. FIG. 7 is the schematic view of the dynamic range and adjustment to avoid memory overflow and underrun. Before the detailed operation of control logic 200 is explained, it is worthwhile to first examine the considerations important to its operation.

As discussed above, even where crystal 32 and a crystal used in the host computer for generating the host USB clock are specified to have the same frequency, almost invariably the reading speed and the writing speed derived from these clock signals would differ causing audio data overflow or underrun at the FIFO 40. The difference between the writing and reading speeds can be reduced by employing high quality crystals for the generation of these speeds. But in order to reduce the cost of the whole system, paritcularly for consumer applications, it is desirable to employ low cost crystals for generating clock signals from which the writing and reading speeds are derived. The invention of the present application enables the reading speed as well as the writing speed to be adjusted to prevent audio data overflow and underrun even where low cost crystals are employed to generate the clock signal for writing and reading data.

When low cost crystals are employed to generate the clock signals for writing or reading audio data from FIFO 40, the difference between the two speeds can be quite large at certain instances, such as upon initialization, so that the clock adjustment system must have sufficient dynamic range to accommodate for such large differences in clock rates. This of course can be accomplished by choosing a coarse resolution in the resolution control divider, that is, by choosing a number for the divisor A. By choosing a large step size (given by 1/A), it is more likely for the clock adjustment to be able to alter the reading or writing speed so that the average reading and writing speeds over time can be equalized. In the preferred embodiment, FIFO overflow or underrun is prevented by adjusting the rate of reading audio data from FIFO 40. If the step size employed in the reading speed adjustment is large, this means that the reading speed will have a large jitter, which introduces distortion during audio data playback and is undesirable. To reduce clock jitter in reading audio data, the adjustment step should be small. If this adjustment step is small, a single adjustment step may not be adequate to compensate for the differential between the writing and reading speeds.

The invention of the present application proposes a solution that would meet both requirements: a wide dynamic range and a fine adjustment step. This solution involves the idea of setting the reading speed according to a reference frequency, where the reference frequency is close to the writing speed. Since the adjustments step may be a set to a small value to reduce clock jitter, it may take a number of adjustment steps to adjust the reading speed from its initial value until it is equal or close to the reference frequency. But once the reading speed has been adjusted to be close to or at such reference frequency, the differentially between the reading speed and the writing speed has been much reduced so that toggling the reading speed between the reference frequency and another frequency only a single small adjustment step away from the reference frequency, typically with some reading cycles in between where the reading speed remains unchanged, would be adequate to cause the average reading speed to be equal to the host writing speed.

In a digital system, it is preferable for the adjustment step to be of the same size; therefore, it will be difficult to adjust the reading speed in a digital system so that it is exactly equal to the writing speed. For this reason, a reference frequency close to the writing speed is chosen to which the reading speed can be adjusted to, and subsequently the reading speed is toggled between such reference frequency and another frequency one adjustment step away from the reference frequency, typically with some reading cycles in between where the reading speed remains unchanged, so that the average reading speed is equal to the writing speed. This avoids audio data overflow or underrun at FIFO 40. This is illustrated by an example set forth below.

As an example to illustrate the above adjustment process, it is assumed that the fines adjustment step is $\delta$ (proportional to 1/A), and that the initial reading speed v2 and 3.3 $\delta$ below the writing speed, as illustrated in FIG. 7. In FIG. 7, the distance between any two adjacent lines, such as lines 212, 214, is $\delta$. As also illustrated in FIG. 7, the reference frequency may be set to values that are integral number of adjustment steps away from the initial CODEC reading speed. In the example given here, it is set to V2+4$\delta$ as described below. After the reading speed is adjusted to such value, the reading speed simply toggles between V2+4$\delta$ and V2+3$\delta$, with some reading cycles in between where the reading speed remains unchanged, so that the average reading speed over time is equal to the writing speed.

In FIG. 6, the difference between the write pointer and the read pointer is as illustrated, where the minimum is where there is no difference between the read pointer and the write pointer and the maximum is the capacity of FIFO 40. Upon start up, no reading of the data is performed until the difference between the read and write pointers is in the middle of the target zone indicated in FIG. 6. Initially, the CODEC reading speed is indicated by the dotted line 210 in FIG. 7 and is 3.3 $\delta$ below the writing speed. This means that more audio data will be written into the FIFO than being read, so that FIFO will start to fill up. This is reflected in the difference between the two pointers, and at some point, such difference will exceed TL1, the top limit for one bit adjustment shown in FIG. 6. At this point, the divisor in subdivider 1 of the controllable divider 174 is adjusted by one bit (the least significant bit) to increase the reference clock applied to device 156 in FIG. 3. This has the effect on device 156 of increasing the frequency output of device 156 and hence the resulting reading speed (frequency of the SYNC signal) by $\delta$ so that the reading speed is now v2+$\delta$ at line 212 in FIG. 7.

As will be noted in FIG. 7, the reading speed will still be 2.3 $\delta$ below the writing speed so that FIFO 40 continues to fill up and the difference between the two pointers would exceed TL2, to top the limit for reference frequency adjustment shown in FIG. 6. This causes the sub-divider 1 in FIG. 5 to again increase the reference clock by $\delta$ so that the new CODEC reading speed is now at V2+2 $\delta$, or at line 214 in FIG. 7. Since this is still below the writing speed, FIFO 40 will continue to fill and sub-divider 1 is caused to increase the reference clock by a another $\delta$ so that reading speed is V2+3$\delta$, or at line 216 in FIG. 7. Since this speed is still below the writing speed, the FIFO continues to fill and this process is repeated once more until reading speed reaches V2+4$\delta$, or at line 218 in FIG. 7. The reference frequency may be deemed to be set at this value. Since this new reading speed is higher than the writing speed, the difference between the two pointers will begin to decrease. Even after the difference has decreased to a value between TL1 and TL2 the reading speed remains unchanged at V2+4 $\delta$. The reading speed still remains unchanged when the difference between the two pointers falls below TL1 into the target zone in FIG. 6. However, when the difference between the two pointers falls below BL1, the bottom limit for 1 bit adjustment indicated in FIG. 6, control logic 200 will cause sub-divider 1 to reduce by one bit (the least significant bit) and the sub-divider 1 causes the reference clock to be reduced by $\delta$ so that the new reading speed will be now at V2+3$\delta$, or at line 216 in FIG. 7. Since this new reading speed is below the writing speed, the difference between the two pointers will start to increase. The reading speed remains at V2+3$\delta$ and line 216 after the difference between the two pointers exceeds BL1 and reaches the target zone. However, when the difference between the two pointers exceeds TL1, the reading speed is adjusted by one bit to V2+4$\delta$, or at line 218 in FIG. 7, so that the difference between the two pointers will start to decrease again and falls below TL1 into the target zone.

The reading speed remains at V2+4$\delta$ until the difference between the two pointers falls below BL1 at which point the reading speed is adjusted to V2+3$\delta$ instead. Thus the reading speed would toggle between V2+4 $\delta$, and V2+3 $\delta$,with some reading cycles in between where the reading speed remains unchanged at V2+4$\delta$ or V2+3$\delta$, and the difference between the two pointer would oscillate to values essentially in the target zone but with some overshoot into the territory between TL1 and TL2 and that between BL1 and BL2.

From the above description, it will be evident that the two apparently inconsistent two objectives of wide dynamic range and small or fine adjustment steps are both accomplished. Since the system is capable of adjusting the reading speed by multiple adjustment steps to compensate for a large difference between the initial reading speed and the writing speed, the system has wide dynamic range. At the same time, since each adjustment step $\delta$ can be made small, and the reading clock adjustment is made gradually, or by a small step δ at a time, the distortion caused in the audio playback is minimized. Such distortion is further minimized by the fact that after the clock adjustment system adjusts the reading speed to the reference frequency, only a single fine adjustment step would need to be made from time to time to cause the average reading speed to be equal to the writing speed.

The detailed implementation of the above adjustment steps will now be described in reference to FIGS. 3, 5–7 and Appendix A. Each of the two sub-dividers 1 and 2 comprises a chain of T flip-flops so that each sub-divider comprises a ripple counter. Sub-divider 2 is controlled by the control signal Res_ctrl from the resolution control register 202 in FIG. 3. The value of the counter in sub-divider 2 is set to the divisor value A for dividing the output of sub-divider 1 by value A to provide the reference clock 178 provided to device 156. By setting the divisor A, the resolution control register 202 sets the minimum step size in the change of the value of the reference clock 178. Another technique in adjusting the reference clock to accommodate the dual wide dynamic range and fine adjustment requirements is by altering the step size δ by changing the value A in divider 154 and sub-divider 2.

In the preferred embodiment, device 156 comprises a phase locked loop which attempts to adjust clock on line 190 to a value so that the reference clock 178 is substantially the same as the input clock at the input of divider 154. Where device 156 in the preferred embodiment is a phase locked loop, it will be understood that other clock adjustment schemes may be used instead. Such and other variations are within the scope of the invention.

Data detector 172 compares the write and read pointers and compares the difference between the two pointer values to the four limits TL1, TL2, BL1, BL2. Depending on the difference between the two pointers in relation to the four limits, data detector 172 sends a four bit signal through two pairs of lines 222, 224 and 226, 228 to controllable divider 174 to perform the reading speed adjustment. Appendix A sets forth the functions performed by divider 174 in response to the value of the four bit signal on lines 222–228. In the example given above, the reference frequency is adjusted upwards, so that the signal on line 222 for adjusting the reference frequency downwards is not involved. For this reason, only the values of the signals on lines 224, 226 and 228 are shown in Appendix A.

Thus, in reference to Appendix A, after power is turned on, the digital signals on lines 224–228 are all zeros and the system locates the reading speed v2 at the dashed line 210 in FIG. 7, although no reading of audio data is performed until the difference between the read and write pointers reaches the middle of the target zone in FIG. 6. This is indicated at checkpoints 0 and 1 in Appendix A. The number of bits in sub-divider 1 determines the dynamic range of the system. For example, if sub-divider 1 is a 6 bit counter, it may be desirable for the initial value of the counter in sub-divider 1 to be set to 31 so that the dynamic range of sub-divider 1 is 63 to 0 (by adding +32, −31 to 31). To simply the discussion, it is assumed that the sub-divider 1 is a four bit counter so that the dynamic range is from +8 to −8 as indicated in FIG. 7. To permit the maximum dynamic range in both directions, the initial reading speed is set at the middle of the dynamic range, or to line 210 in FIG. 7 in this instance. This is performed by causing the control logic 200 to set the value of the sub-divider 1 to 7 initially by means of the set signals S1-Sn and reset signals R1-Rn in FIG. 5.

As described in the example above, where the initial reading speed v2 is much below the writing speed, the difference between the two pointer values will exceed TL1 at some point, at which point data detector 172 will cause the digital signal on line 226 to change from 0 to 1. See check point 2 in Appendix A. This will cause control logic 200 to alter the set and reset signals that will cause the counter in subdivider 1 to be incremented by 1. If pll_out is the clock output on line 190 when sub-divider 1 has the value 7, the new signal output on line 190 after sub-divider is incremented to 8 will be given by 8/7 (pll_out) where the divisor A applied by sub-divider 2 is cancelled out in the process. Sub-dividers 1 and 2 are presettable counters, where sub-divider 1 is preset by the values on the reset and set signals R1-RN, S1-SN and sub-divider 2 is preset by the signal Res_ctrl. When both counters in sub-dividers 1 and 2 count down to 0, a signal transition is caused at output 178 which is applied to the device 156 as the reference clock, and the signals on the two carry lines carry 1 and carry 2 become high. This will cause control logic 200 to trigger a new preset of sub-divider 1. As illustrated in FIG. 5, each flip flop in sub-divider 1 can be reset and set individually so that the value of sub-divider 1 can be preset to any value desired before is starts to count down. Thus, in general, where pll_out is the output of device 156 on line 190 when the value of sub-divider 1 is B, when the value of sub-divider 1 has been reset in the next reading cycle to B', the new output of device 156 on line 190 after the sub-divider 1 counts to 0 will be (B'/B)pll_out.

As noted aboved, incrementing the value of sub-divider by 1 and causing the read speed from FIFO 40 to be at line 212 will still result in the difference between the write and read pointers increasing to beyond TL2. At this point, the value of the digital signal 224 is also changed from 0 to a 1 and divider 174 will cause sub-divider 1 to again be preset to a higher value when carry 1 and carry 2 become high, initiating the next cycle. Thus the read speed is adjusted now to the value at line 214 in FIG. 7, or at v2+2δ. Note check points 2–4. As noted above, this is still inadequate to catch up to the writing speed so that FIFO 40 continues to fill and the above described process is repeated as described above until the read speed reaches line 218, or the value v2+4δ. See check points 4–6. At this point, the reading speed is higher than the writing speed so that more audio data will be read from FIFO 40 than written into it. At some point, the difference between the two pointers will fall below TL2 so that the signal on line 224 is changed to a 0 as indicated in checkpoint 7 in Appendix A. This is detected by data detector 172, but no change is made to the reading speed so that the difference between the two pointers will continue to fall across TL1. At this point, the signal on line 226 is changed from 1 to 0 as noted in checkpoint 9, but no change is made to the reading speed so that the difference between the pointers will continue to fall. When such difference falls below limit BL1, the signal on line 228 changed from a 0 to a 1 and divider 174 will cause the value in sub-divider to be decremented by 1 as shown in checkpoint 11. This causes the reading speed to be decreased to that at line 216 which is below the writing speed. This causes the FIFO 40 to start filling up and the difference between the two pointers to cross BL1 into the target zone, at which point the signal on line 228 is changed from 1 to 0 as shown in checkpoint 12. No change is made to the reading speed so that the FIFO 40 continues to fill up until the difference between the two pointers crosses TL1 at checkpoint 14. At this point, the signal on line 226 goes from 0 to 1 and control logic 200 causes sub-divider 1 to be incremented by 1 when carry 1 and carry 2 become high, causing the control logic 200 to preset sub-divider 1 for the next cycle. This again causes more audio data to be read out from the FIFO 40 than written into it so that the difference between the two pointers will decrease and cross TL1 as shown in checkpoint 15. At this point, the signal on line 226 is changed from 1 to 0 (check point 15). Thus the reading speed oscillates between the two lines 216 and 218 and the difference between the two pointers oscillates between TL1 and BL1 with some overshot beyond these two limits but not beyond TL2 and BL2.

From the above process, it is seen that aside from the initial adjustment of the reference frequency to 218, the reading frequency changes only occasionally by fine steps between lines 216 and 218. The dual goals of wide dynamic range and minimal distortion are therefore achieved.

If the initial reading speed from FIFO 40 is above the host writing speed, the signal on line 222 will perform a function similar to that on line 224 for adjusting the reference frequency downwards. Once the reference frequency has been adjusted to a value close to the host writing speed, the signals on lines 226 and 228 are then used form toggling the reading speed between the reference frequency and the frequency one fine adjustment above the reference frequency.

Preferably data detector 172 may be implemented as a look up table or programmable logic. Alternatively, it may also be a controller implemented in discrete components or integrated circuit. So is the controllable divider 174.

While memory overflow and underrun are avoided as described aboved by adjusting the speed of reading from the FIFO, it will be understood that a similar adjustment may be made to the writing speed instead. Substantially the same circuit and algorithm may be applied for adjusting the writing speed into FIFO 40. Such and other variations are within the scope of the invention.

While the invention has been described by reference to various embodiments, it will be understood that different changes and modifications may be made without departing from the scope of the invention which is to be defined only by the appended claims and their equivalents.

control signals sequence in the example

| Check point | Ref_up 224 | Bit_up 226 | Bit_down 228 | Events | Data depth change |
|---|---|---|---|---|---|
| 0 | 0 | 0 | 0 | Power on Read speed locate at dashed line in FIG. 7 | 0 |
| 1 | 0 | 0 | 0 | CODEC start to read data from FIFO | In the middle of target zone |
| 2 | 0 | 0 -> 1 | 0 | Data depth in FIFO goes above TL1 but still below TL2, 1 bit adjustment logic move read frequency 1 step up to +1 line in FIG. 7 | Increase |
| 3 | 0 -> 1 | 1 | 0 | Data depth in FIFO goes up across TL2 to #1 in FIG. 6 | Increase |
| 4 | 1 | 1 | 0 | Reference frequency move 1 step up to +2 line, but 1 bit adjustment logic doesn't add more Data depth in FIFO still above TL2 in FIG. 6 | Increase |
| 5 | 1 | 1 | 0 | Reference frequency move 1 step up to +3 line, 1 bit adjustment logic doesn't add more Data depth in FIFO still above TL2 in FIG. 6 | Increase |
| 6 | 1 | 1 | 0 | Reference frequency move 1 step up to +4 line, 1 bit adjustment logic doesn't add more Data depth in FIFO still above TL2 in FIG. 6 | Increase |
| 7 | 1 -> 0 | 1 | 0 | Data depth goes down across TL2 in FIG. 6 | Decrease |
| 8 | 0 | 1 | 0 | Reading frequency keep old value | Decrease |
| 9 | 0 | 1 -> 0 | 0 | Data depth goes down across TL1 | Decrease |
| 10 | 0 | 0 | 0 | | Decrease |
| 11 | 0 | 0 | 0 -> 1 | Data depth hit BL1 in FIG. 6, 1 bit adjustment logic moves reading frequency 1 step down to +3 line in FIG. 7 | Start to Increase |
| 12 | 0 | 0 | 1 -> 0 | Data depth goes back to target zone | Increase |
| 13 | 0 | 0 | 0 | | Increase |
| 14 | 0 | 0 -> 1 | 0 | Data depth hit TL1 in FIG. 6, 1 bit adjustment logic moves reading frequency 1 step up to +4 line in FIG. 7 | Start to decrease |
| 15 | 0 | 1 -> 0 | 0 | Data depth goes back to target zone | Decrease |
| 16 | 0 | 0 | 0 | | Decrease |
| 17 | | | | Repeat 11–16 | |

What is claimed is:

1. An apparatus for adjusting rate of reading audio data from a memory, comprising:
   detector means for providing an output signal to indicate a condition that will cause memory overflow or underrun;
   a phase locked loop generating a clock signal for controlling the rate of reading or writing the audio data from or into the memory; and
   means for causing the phase locked loop to adjust the clock signal in response to the detector means output signal to avoid memory overflow and underrun.

2. The apparatus of claim 1, wherein said causing means includes a divider circuit generating and supplying a reference clock to the phase locked loop by dividing said clock signal by a divisor in response to the detector means output signal.

3. The apparatus of claim 2, wherein said divider circuit includes a resolution control counter for adjusting value of said divisor to avoid memory overflow or underrun.

4. The apparatus of claim 2, said divider circuit including a counter for counting a divisor number used for dividing said clock signal, wherein said divider circuit derives an updated value B' of the divisor number from a present value B of the divisor number in response to the detector means out put signal.

5. The apparatus of claim 4, wherein the divider circuit derives the updated value B' of the divisor number by incrementing or decrementing the present value B of the divisor number by 1, or by leaving the present value of the divisor number unchanged.

6. The apparatus of claim 5, wherein after the counter has counted by said updated value of the divisor number, said divider circuit provides to said phase locked loop a reference clock given by substantially the clock signal at the output of the phase locked loop before the counter counts by said updated value multiplied by B'/B.

7. The apparatus of claim 5, said divider circuit further comprising control means for incrementing, decrementing, or leaving unchanged the present divisor number in response to the detector means output signal when said counter has counted by the present value of the divisor number.

8. The apparatus of claim 7, wherein said control means increments or decrements the divisor number by 1, or leaves the divisor number unchanged when said counter has counted by the present value of the divisor number.

9. The apparatus of claim 7, wherein said detector means compares a difference between a write pointer and a read pointer for the memory to one or more thresholds to detect said condition.

10. The apparatus of claim 9, wherein said detector means and control means cause the rate of reading to change between a reference frequency and a frequency that differs from said reference frequency by a small differential when said difference is between a first and a second top limit or a first and a second bottom limit, thereby avoiding memory overflow and underrun.

11. The apparatus of claim 10, said second top limit being greater than the first top limit, said second bottom limit being smaller than the first bottom limit, wherein said detector means and control means cause the reference frequency to be increased when said difference is greater than said second top limit, and the reference frequency to be decreased when said difference is smaller than said second bottom limit, thereby avoiding memory overflow and underrun.

12. The apparatus of claim 11, wherein said control means increments or decrements the divisor number by 1, or leaves the divisor number unchanged when said counter counts to a present value of the divisor number.

13. An apparatus for recording and playback of audio data, comprising:
- an audio CODEC for analog to digital and digital t analog audio data conversion for supplying analog audio data to a speaker and receiving analog audio data from a microphone;
- a memory storing audio data to be converted by the CODEC,
- detector means for providing an output signal to indiciate a condition that will cause memory overflow or undderrun;
- a device generating a clock output signal for controllin the rate of reading or writing audio data from or into the memory; and
- means for causing the device to adjust the clock output signal in response to the detector means output signal to avoid memory overflow and underrun.

14. The apparatus of claim 13, wherein said causing means includes a divider circuit generating and supplying a reference clock to the phase locked loop by dividing said clock signal by a divisor in response to the detector means output signal.

15. The apparatus of claim 14, said apparatus useful for adjusting said rate of reading data in response to conditions affecting rate of writing data into said memory, wherein said divider circuit includes a resolution control counter for adjusting value of said divisor to avoid memory overflow or underrun caused by said conditions.

16. The apparatus of claim 14, said circuit including a counter for counting a divisor number used for dividing said clock signal, wherein said divider circuit derives an updated value B' of the divisor number from a present value B of the divisor number in response to the detector means output signal.

17. The apparatus of claim 16, wherein the counter derives the updated value B' of the number by incrementing or decrementing the present value B of the divisor number by 1, or by leaving the present value of the divisor number unchanged.

18. The apparatus of claim 17, wherein after the counter counts to said updated value of the divisor number, said divider circuit provides to said device a reference clock given by substantially the clock signal at the output of the device before the counter counts to said updated value multiplied by B'/B.

19. The apparatus of claim 17, said divider circuit further comprising control means for incrementing, decrementing, or leaving unchanged the present divisor number in response to the detector means output signal when said counter has counted by the present value of the divisor number.

20. The apparatus of claim 19, wherein said control means increments or decrements the divisor number by 1, or leaves the divisor number unchanged when said counter has counted by the present value of the divisor number.

21. The apparatus of claim 19, wherein said detector means compares a difference between a write pointer and a read pointer for the memory to one or more thresholds to detect said condition.

22. The apparatus of claim 21, wherein said detector means and control means cause the rate of reading to change between a reference frequency and a frequency that differs from said reference frequency by a small differential when said difference is between a first and a second top limit or a first and a second bottom limit, thereby avoiding memory overflow and underrun.

23. The apparatus of claim 22, said second top limit being greater than the first top limit, said second bottom limit being smaller than the first bottom limit, wherein said detector means and control means cause the reference frequency to be increased when said difference is greater than said second top limit, and the reference frequency to be decreased when said difference is smaller than said second bottom limit, thereby avoiding memory overflow and underrun.

24. A method for adjusting rate of reading audio data from a memory. comprising:
- providing an output signal to indicate a condition that causes memory overflow or underrun;
- causing a phase locked loop to generate a clock output signal for controlling the rate of reading or writing the audio data from or into the memory; and causing the phase locked loop to adjust the clock signal in response to the output signal to avoid memory overflow and underrun.

25. An apparatus for adjusting rate of reading audio data from a memory, comprising:
    a detector providing an output signal to indicate a condition that will cause memory overflow or underrun;
    a phase locked loop generating a clock signal for controlling the rate of reading of writing the audio data from or into the memory; and
    a device causing the phase locked loop to adjust the clock signal in response to the detector output signal to avoid memory overflow and underrun.

26. The apparatus of claim 25, wherein said device includes a divider circuit generating and supplying a reference clock to the phase locked loop by dividing said clock signal by a divisor in response to the detector output signal.

27. The apparatus of claim 26, wherein said divider circuit includes a resolution control counter for adjusting value of said divisor to avoid memory overflow or underrun.

28. The apparatus of claim 26, said divider circuit including a counter for counting a divisor number used for dividing said clock signal, wherein said divider circuit number in response to the detector output signal.

29. The apparatus of claim 28, wherein the divider circuit derives the updated value B' of the divisor number by incrementing or decrementing the present value B of the divisor number by 1, or by leaving the present value of the divisor number unchanged.

30. The apparatus of claim 29, wherein after the counter has counted by said updated value of the divisor number, said divider circuit provides to said phase locked loop a reference clock given by substantially the clock signal at the output of the phase locked loop before the counter counts by said updated value multiplied by B'/B.

31. The apparatus of claim 29, said divider circuit further comprising control means for incrementing, decrementing, or leaving unchanged the present divisor number in response to the detector output signal when said counter has counted by the present value of the divisor number.

32. The apparatus of claim 31, wherein said control means increments or decrements the divisor number by 1, or leaves the divisor number unchanged when said counter has counted by the present value of the divisor number.

33. The apparatus of claim 31, wherein said detector compares a difference between a write pointer and a read pointer for the memory to one or more thresholds to detect said condition.

34. The apparatus of claim 33, wherein said detector and control means cause the rate of reading to change between a reference frequency and a frequency that differs from said reference frequency by a small differential when said difference is between a first and a second top limit or a first and a second bottom limit, thereby avoiding memory overflow and underrun.

35. The apparatus of claim 34, said second top limit being greater than the first top limit, said second bottom limit being smaller than the first bottom limit, wherein said detector and control means cause the reference frequency to be increased when said difference is greater than said second top limit, and the reference frequency to be decreased when said difference is smaller than said second bottom limit, thereby avoiding memory overflow and underrun.

36. The apparatus of claim 35, wherein said control means increments or decrements the divisor number by 1, or leaves the divisor number unchanged when said counter counts to a present value of the divisor number.

37. An apparatus for recording and playback of audio data, comprising:
    an audio CODEC for analog to digital and digital to analog audio data conversion for supplying analog audio data to a speaker and receiving analog audio data from a microphone;
    a memory storing audio data to be converted by the CODEC;
    a detector for providing and output signal to indicated a condition that will cause memory overflow and underrun;
    a device generating a clock output signal for controlling the rate of reading or writing audio data from or into the memory; and
    a circuit causing the device to adjust the clock output signal in response to the detector output signal to avoid memory overflow and underrun.

38. The apparatus of claim 37, wherein said device includes a divider circuit generating and supplying a reference clock to the phase locked loop by dividing said clock signal by a divisor in response to the detector output signal.

39. The apparatus of claim 38, said apparatus useful for adjusting said rate of reading data in response to conditions affecting rate of writing data into said memory, wherein said divider circuit includes a resolution control counter for adjusting value of said divisor to avoid memory overflow or underrun caused by said conditions.

40. The apparatus of claim 38, said divider circuit including a counter for counting a divisor number used for dividing said clock signal, wherein said divider circuit derives an updated value B' of the divisor number from a present value B of the divisor number in response to the detector output signal.

41. The apparatus of claim 40, wherein the counter derives the updated value B' of the divisor number by incrementing or decrementing the present value B of the divisor number by 1, or by leaving the present value of the divisor number unchanged.

42. The apparatus of claim 41, wherein after the counter counts to said updated value of the divisor number, said divider circuit provides to said device a reference clock given by substantially the clock signal at the output of the device before the counter counts to said updated value multiplied by B'/B.

43. The apparatus of claim 41, said divider circuit further comprising control means for incrementing, decrementing, or leaving unchanged the present divisor number in response to the detector output signal when said counter has counted by the present value of the divisor number.

44. The apparatus of claim 43, wherein said control means increments or decrements the divisor number by 1, or leaves the divisor number unchanged when said counter has counted by the present value of the divisor number.

45. The apparatus of claim 43 wherein said detector compares a difference between a write pointer and a read pointer for the memory to one or more thresholds to detect said condition.

46. The apparatus of claim 45, wherein said detector and control means cause the rate of reading to change between a reference frequency and a frequency that differs from said reference frequency by a small differential when said difference is between a first and a second top limit or a first and a second bottom limit, thereby avoiding memory overflow and underrun.

47. The apparatus of claim 46, said second top limit being greater than the first top limit, said second bottom limit being smaller than the first bottom limit, wherein said detector and control means cause the reference frequency to be increased when said difference is greater than said second to limit, and the reference frequency to be decreased when said difference is smaller than said second bottom limit, thereby avoiding memory overflow and underrun.

* * * * *